United States Patent
Zhu et al.

(10) Patent No.: US 7,985,681 B2
(45) Date of Patent: Jul. 26, 2011

(54) METHOD FOR SELECTIVELY FORMING SYMMETRICAL OR ASYMMETRICAL FEATURES USING A SYMMETRICAL PHOTOMASK DURING FABRICATION OF A SEMICONDUCTOR DEVICE AND ELECTRONIC SYSTEMS INCLUDING THE SEMICONDUCTOR DEVICE

(75) Inventors: Hongbin Zhu, Boise, ID (US); Jeremy Madsen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1053 days.

(21) Appl. No.: 11/766,931

(22) Filed: Jun. 22, 2007

(65) Prior Publication Data
US 2008/0318032 A1    Dec. 25, 2008

(51) Int. Cl.
*H01L 21/461* (2006.01)
(52) U.S. Cl. ........ 438/689; 438/690; 438/691; 438/692; 216/37; 427/198
(58) Field of Classification Search .......... 438/689–692, 438/696; 216/37; 427/198, 430
See application file for complete search history.

(56) References Cited

U.S. PATENT DOCUMENTS

| | | | |
|---|---|---|---|
| 5,259,923 A | 11/1993 | Hori et al. | |
| 5,356,828 A * | 10/1994 | Swan et al. | 438/433 |
| 5,411,913 A * | 5/1995 | Bashir et al. | 438/427 |
| 6,191,016 B1 | 2/2001 | Chau et al. | |
| 6,297,163 B1 * | 10/2001 | Zhu et al. | 438/707 |
| 6,583,054 B2 * | 6/2003 | Kwon | 438/638 |
| 7,115,525 B2 | 10/2006 | Abatchev | |
| 7,151,040 B2 | 12/2006 | Tran | |
| 7,285,499 B1 * | 10/2007 | Bell et al. | 438/706 |
| 7,402,486 B2 * | 7/2008 | Kang | 438/238 |
| 2006/0134877 A1* | 6/2006 | Goebel et al. | 438/389 |
| 2006/0211260 A1* | 9/2006 | Tran et al. | 438/763 |

OTHER PUBLICATIONS

Kim Jin Hong et al. IEEE Transactions on Electron Devices, Vo.46, No. 5, May 1999., pp. 984-992.*

* cited by examiner

*Primary Examiner* — Duy-Vu N Deo
*Assistant Examiner* — Maki A Angadi (57) ABSTRACT

A method for patterning a material during fabrication of a semiconductor device provides for the selective formation of either asymmetrical features or symmetrical features using a symmetrical photomask, depending on which process flow is chosen. The resulting features which are fabricated use spacers formed around a patterned material. If one particular etch is used to remove a base material, symmetrical features result. If two particular etches are used to remove the base material, asymmetrical features remain.

15 Claims, 9 Drawing Sheets

METHOD FOR SELECTIVELY FORMING SYMMETRICAL OR ASYMMETRICAL FEATURES USING A SYMMETRICAL PHOTOMASK DURING FABRICATION OF A SEMICONDUCTOR DEVICE AND ELECTRONIC SYSTEMS INCLUDING THE SEMICONDUCTOR DEVICE

TECHNICAL FIELD

Various embodiments of the present invention relate to the field of semiconductor manufacture. More particularly, embodiments of the present invention disclose a method for selectively forming symmetrical or asymmetrical features using a symmetrical photomask.

BACKGROUND

During the formation of a semiconductor device, many features such as conductive lines, contacts, dielectric isolation, and other features are commonly formed over and within a semiconductor wafer. A goal of semiconductor device engineers is to form as many of these features in a given area as possible to increase yields, decrease manufacturing costs, and to miniaturize devices. The formation of these structures typically requires the use of lithography. Optical lithography, the lithographic method most used in leading-edge wafer processing, comprises projecting coherent light of a given wavelength, typically 248 nanometers (nm) or 193 nm, from an illumination source (illuminator) through a quartz photomask or reticle having a chrome pattern representative of features to be formed, and imaging that pattern onto a wafer coated with photoresist. The light chemically alters the photoresist and enables the exposed photoresist (if positive resist is used) or the unexposed photoresist (if negative resist is used) to be rinsed away using a developer.

Semiconductor device processing often requires the formation of symmetrical features having uniform sizes, and asymmetrical features having different sizes. To form symmetrical features, a reticle having a regular chrome pattern is used to expose the photoresist. The formation of asymmetrical features, features having two (or more) different shapes and/or electrical properties, typically requires the use of two (or more) reticles, with one reticle defining the pattern of each feature.

The manufacture of reticles is time consuming and expensive due to the complexity of a typical reticle used in semiconductor device fabrication. A photolithography method which provides for the selective formation of either symmetrical features or asymmetrical features using a single reticle would be desirable.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with materials including dielectrics and conductors and features such as transistors formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two materials, one "on" the other, means at least some contact between the materials, while "over" means the materials are in close proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be altered, as long as the alteration does not result in nonconformance of the process or structure in question to the illustrated embodiment of the present invention. A "spacers" indicates a material, typically dielectric, formed as a conformal material over uneven topography then anisotropically etched to remove horizontal portions of the material and leaving vertical portions of the material.

An embodiment of the present invention provides for the selective formation of either symmetrical features or asymmetrical features using a single reticle having a regular feature pattern. A process which results in the formation of a pattern of asymmetrical features is depicted by FIGS. 1-8, and a process which results in the formation of a pattern of symmetrical features is depicted by FIGS. 1, 2, and 9-13.

Figure 1:
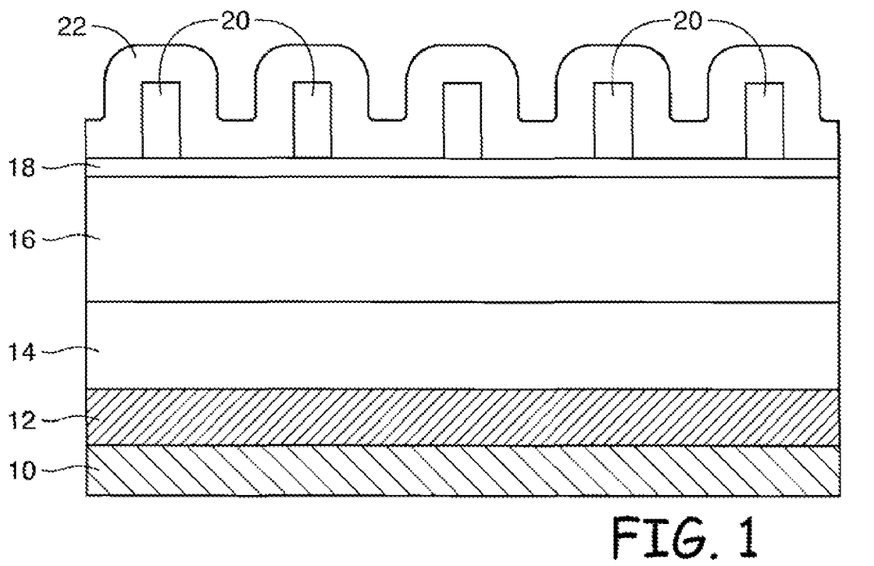
FIGS. 1-2 are cross sections depicting a starting structure for various embodiments of the present invention.

FIG. 1 depicts a portion of a semiconductor wafer substrate assembly comprising polysilicon 10 about 750 angstroms (Å) thick; tungsten silicide ($WSi_x$) 12 about 900 Å thick; tetraethyl orthosilicate (TEOS) 14 about 1,400 Å thick; transparent carbon (TC) 16 about 2,000 Å thick; dielectric antireflective coating (DARC) 18 from about 200 Å to about 360 Å thick; photoresist (resist) 20 having uniform dimensions from about 40 Å to about 70 Å in horizontal width, from about 1,200 Å to about 2,000 Å in vertical height, with the resist features having a regular pitch (i.e. a uniform distance between analogous points of adjacent resist features) of from about 170 Å to about 200 Å; and conformal spacer material 22, for example comprising silicon nitride ($Si_3N_4$) from about 300 Å to about 500 Å thick. Individually, each of these materials and their formation is known in the art. The resist provides a first mask material which will be used to define spacers, and the spacer material will provide a second mask which will be used to define the underlying material.

It will be appreciated from the description below that materials other than those specified may be used for each of the materials, depending on the use of the invention. In this embodiment, the several materials depicted in FIG. 1 may be used to form a NAND flash memory device. In an alternate embodiment, each of materials 10-18 may be replaced by a single dielectric material such as borophosphosilicate glass (BPSG) to form another type of device, or to form other features on a NAND flash device. Further, if the depicted materials are used, the thicknesses may vary over a wide range beyond the values listed in the preceding paragraph, but these materials and thicknesses are believed sufficient for use during NAND flash device formation with current technology. The thickness variation of the DARC material, however, may be limited by photolithography constraints, and any variation in resist and spacer width may be limited by feature pitch.

Figure 2:
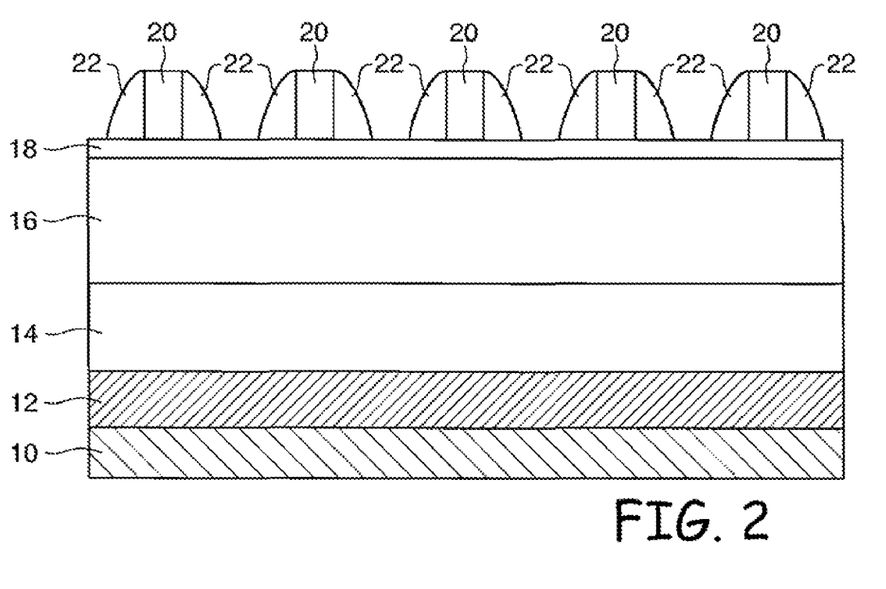

The conformal spacer material 22 of FIG. 1 is etched using a vertical anisotropic etch to form a plurality of spacers 22 as depicted in FIG. 2. This etch removes spacer material selective to patterned material 20 and DARC material 18 (i.e. it will remove spacer material 22 while minimizing etching of patterned material 20 and DARC 18). FIG. 2 depicts paired cross sectional spacers contacting each mask feature 20.

Figure 3:
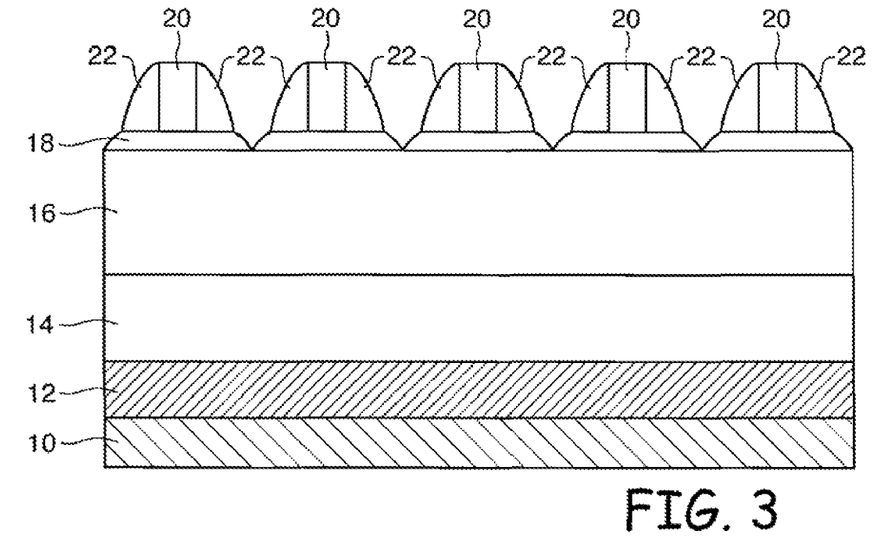
FIGS. 3-8 are cross sections depicting a first embodiment of the present invention.

After etching spacers 22 as depicted in FIG. 2, DARC 18 is etched selective to patterned material 20 and spacers 22 using an anisotropic etch which has some isotropic properties to result in the FIG. 3 structure. This etch will preferably stop on or in TC 16, and may comprise tetrafluoromethane ($CF_4$) at a flow rate of from about 60 sccm to about 160 sccm, difluoromethane ($CH_2F_2$) at a flow rate of from about 5 sccm to about 60 sccm, and trifluoromethane ($CHF_3$) at a flow rate of about 100 sccm. During the etch, chamber pressure may be maintained to between about 5 millitorr and about 20 millitorr, and power in the range of about 600 watts to about 1,200 watts. While some undercutting of the dielectric under the spacer may occur, undercutting is preferably minimized. This etch forms one or more sloped recesses within DARC 18 resulting from the slope of the spacers 22, the pitch of adjacent spacers, and the qualities of the etch. In one embodiment, the sloped recess will have a depth of from about 200 Å to about 360 Å.

Figure 4:
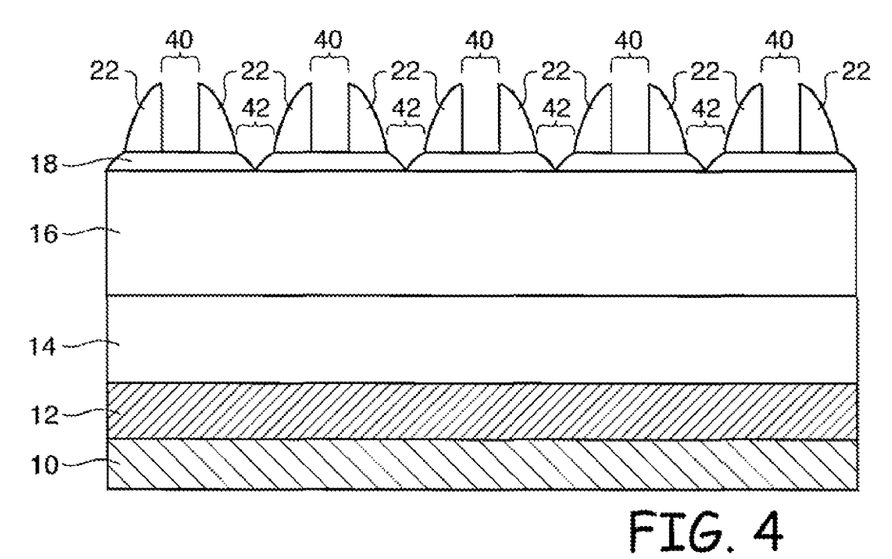

After etching the sloped recesses as depicted in FIG. 3, the patterned material 20 is removed selective to spacers 22, DARC 18, and any exposed TC 16 using any appropriate etch to result in the FIG. 4 structure. One preferred etch comprises a mixture of sulfur dioxide ($SO_2$) at a flow rate of about 120 sccm and oxygen ($O_2$) at a flow rate of about 80 sccm. This etch may comprise the use of about 800 watts power, 8 mT pressure, and a bias voltage of 400 V. Another sufficient etch would comprise the use of hydrogen bromide (HBr), $O_2$, and nitrogen ($N_2$) optimized for the etch. Locations 40 depict openings between spacers 22 where the patterned material 20 has been removed to expose DARC 18. These regions of exposed DARC 18 have a horizontal profile. Locations 42 depict the sloped recesses within DARC 18 between spacers 22. Regions 42 of exposed DARC 18 have a more vertically oriented profile than the exposed horizontal portions 40 where patterned material 20 has been removed.

Figure 5:
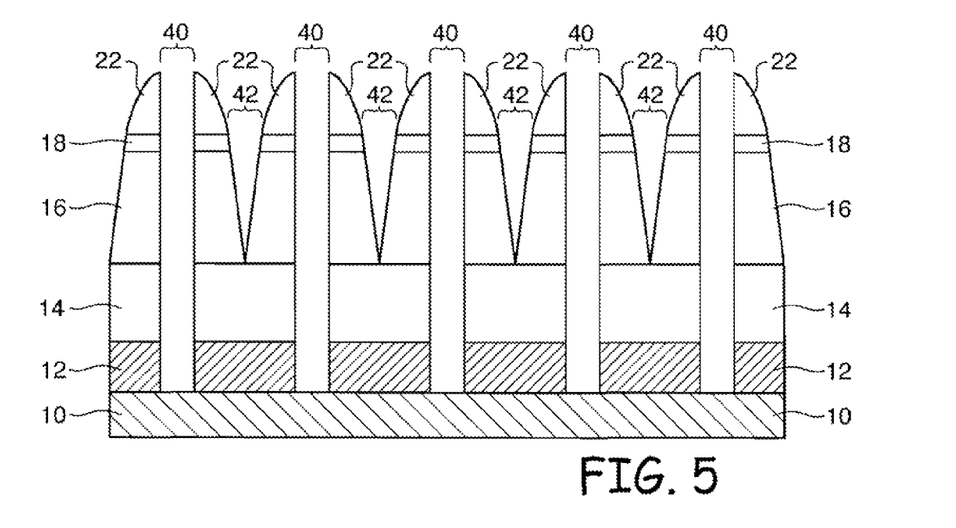

Subsequently, DARC 18, TC 16, TEOS 14, and $WSi_x$ 12 are etched using a vertical anisotropic etch which is selective to spacers 22 and which stops on or in polysilicon 10 to result in the structure of FIG. 5. Various known etches may be used to remove each of these materials to transfer the initial pattern to the underlayers. As depicted in FIG. 5, a lesser volume of material has been removed from materials 12-18 to form openings 42 than to form openings 40. Locations 40 of the depicted materials etch more quickly than locations 42, which may be due to the higher impact energy of the etchant as it contacts the horizontal bottom of the various materials at location 40, while the etchant may be deflected by the sloped sidewalls of spacers 22 at locations 42. Thus FIG. 5 depicts regions 40 which have a rectangular profile, which etch deeper than regions 42 which have a "V" shaped profile.

Figure 6:
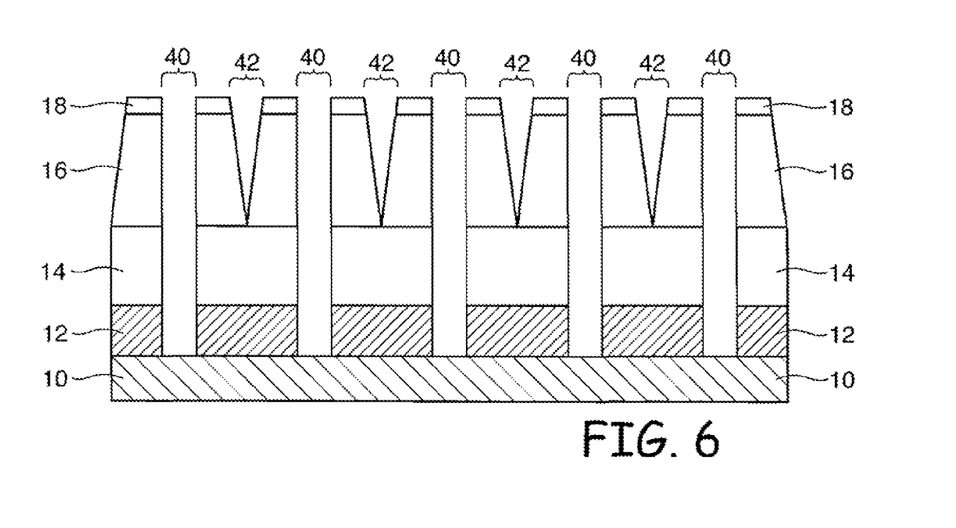

After forming the FIG. 5 structure, spacers 22 may be removed selective to the exposed materials to result in the FIG. 6 structure. FIG. 6 depicts openings at location 40 which are asymmetrical with respect to openings at location 42. These openings 40, 42 have been formed using the symmetrical patterned material 20 as depicted in FIG. 1, and may result from the difference in slope between the two vertically oriented sides of each spacer. As depicted in FIG. 4, for example, the side of each spacer which physically contacts patterned material 20 is linear and generally vertical (i.e. has a vertical or near-vertical profile), while the side of each spacer which does not contact patterned material 20 is more sloped and has a more rounded profile.

Figure 7:
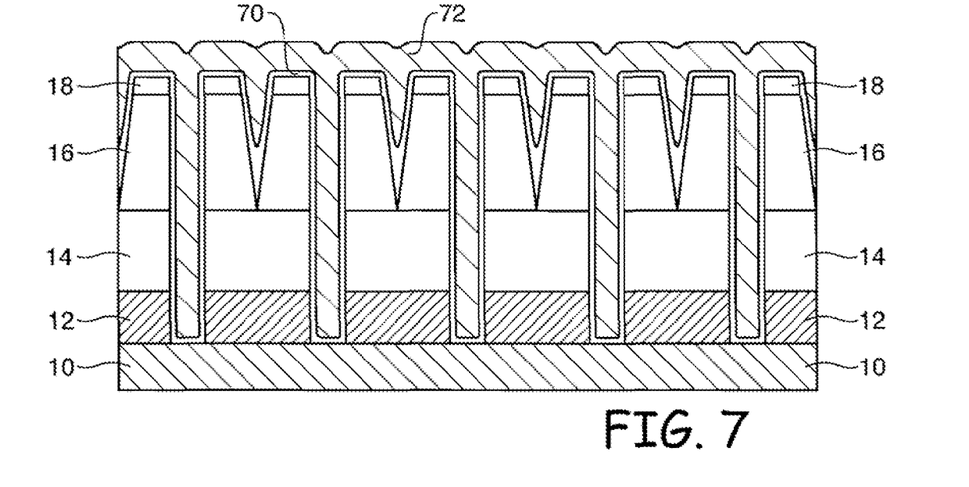
Figure 8:
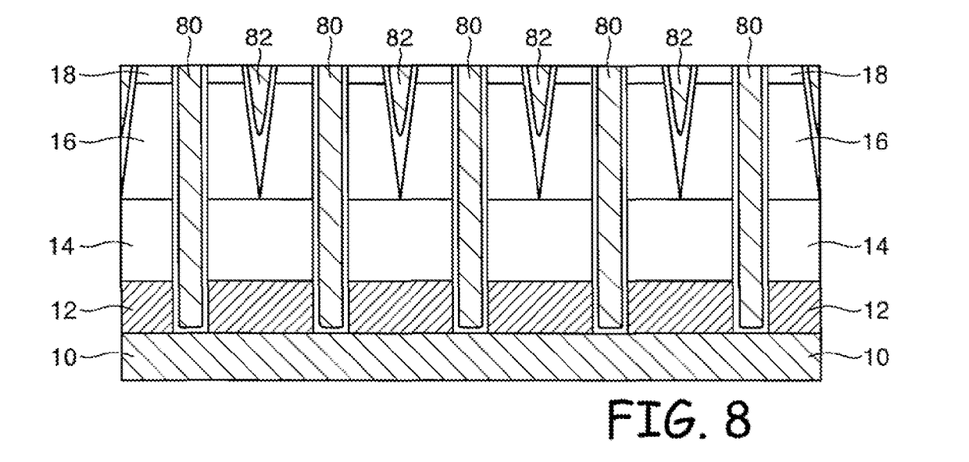

While various continuing processes may be completed with the FIG. 6 structure, one use is depicted in FIGS. 7 and 8. A blanket dielectric material 70 and a blanket conductive material 72 may be formed over the surface of the FIG. 6 structure to fill the openings at locations 40 and 42 as depicted in FIG. 7. Next, a planarizing process such as mechanical planarization, for example chemical-mechanical planarization (CMP), is performed on material 70 to result in the FIG. 8 structure. FIG. 8 depicts conductive features 80 having a first cross section and features 82 having a second cross section different from the first cross section. Features 80 may have different electrical properties than features 82, particularly if the features are generally uniform along their length. For example, the resistance of features 80 may be lower than features 82 due to the larger cross sectional area features 82. Further, the two features 80, 82 may form two different isolation lines, particularly with a doped substrate and oxide or another dielectric filling the trenches.

In another embodiment of the invention, symmetrical features using the same reticle used to form the patterned material 20 of FIG. 1 is depicted in FIGS. 1, 2, and 9-13. In this embodiment, the structures of FIGS. 1 and 2 are formed in accordance with the embodiment described above.

Figure 9:
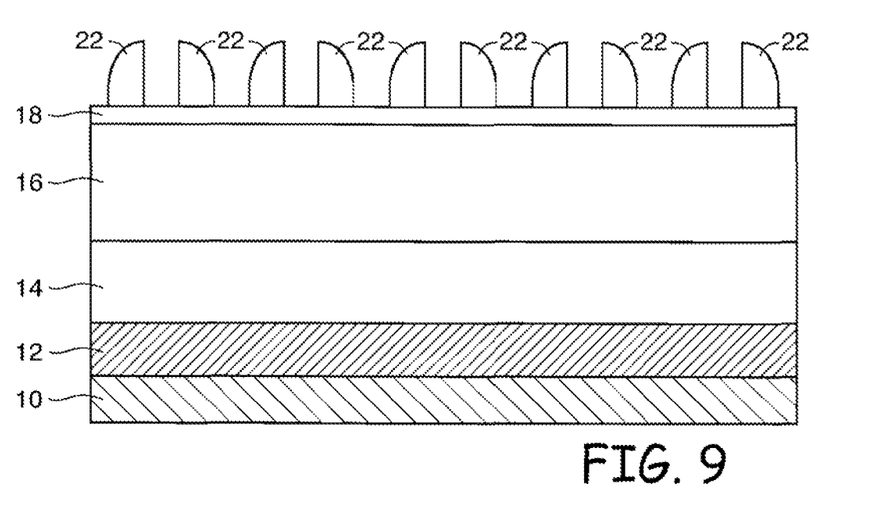
FIGS. 9-13 are cross sections depicting a second embodiment of the present invention.
Figure 10:
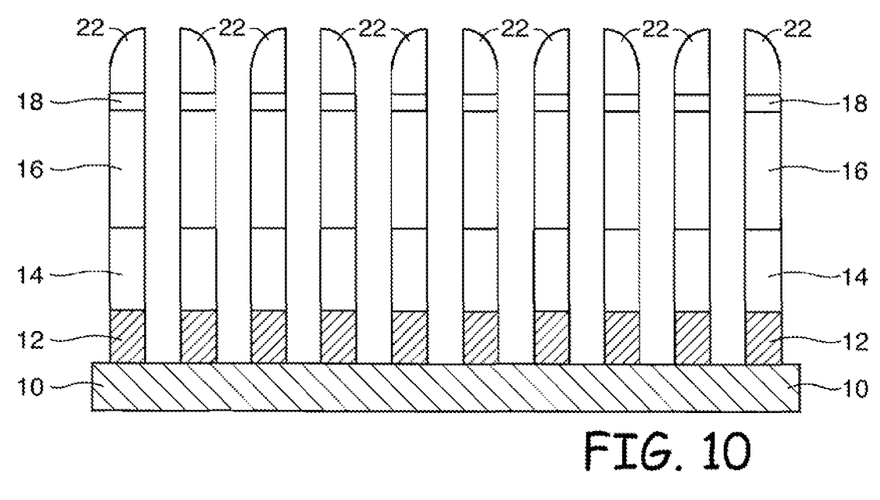

After forming the structure of FIG. 2, patterned material 20 is removed selective to DARC 18 and spacers 22 to result in the structure of FIG. 9. Next, DARC 18, TC 16, TEOS 14, and $WSi_x$ 12 are etched selective to spacers 22 using an isotropic etch to result in the structure of FIG. 10. The DARC may be etched using an isotropic etch such as $CF_4/CH_2F_2$, where the $CF_4:CH_2F_2$ ratio is at least 4. TC may be etched with $SO_2/O_2$ as discussed with the previous embodiment. TEOS may be etched with $CF_4$ at a flow rate of about 75 sccm and $O_2$ at a flow rate of about 45 sccm, a chamber pressure of 5 mT, and a power of 1,500 watts, and a bias voltage of 300 V. Tungsten silicide may be etched with nitrogen trifluoride ($NF_3$) and chlorine ($Cl_2$) each at a flow rate of about 40 sccm, a power of about 15 mT, a power of about 400 watts, and an bias voltage of about 150 V, although other etch processes may be used.

Subsequently, spacers 22 may be removed selective to the exposed materials to result in the FIG. 11 structure, which depicts symmetrical openings 110 etched into DARC 18, TC 16, TEOS 14, and $WSi_x$ 12. These symmetrical openings are formed using the patterned material 20 of FIG. 2, which was used to form the asymmetrical openings of the previous embodiment. Thus either symmetrical or asymmetrical features may be formed using the same symmetrical pattern.

Figure 11:
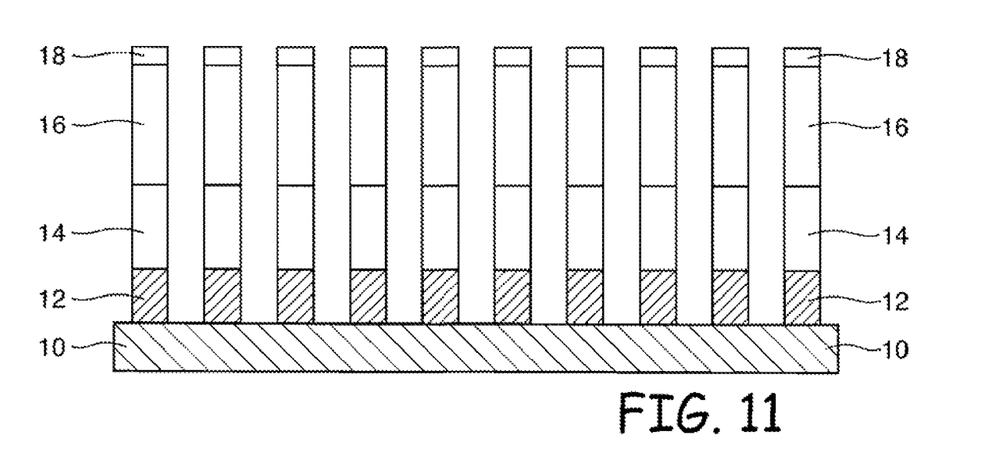
Figure 12:
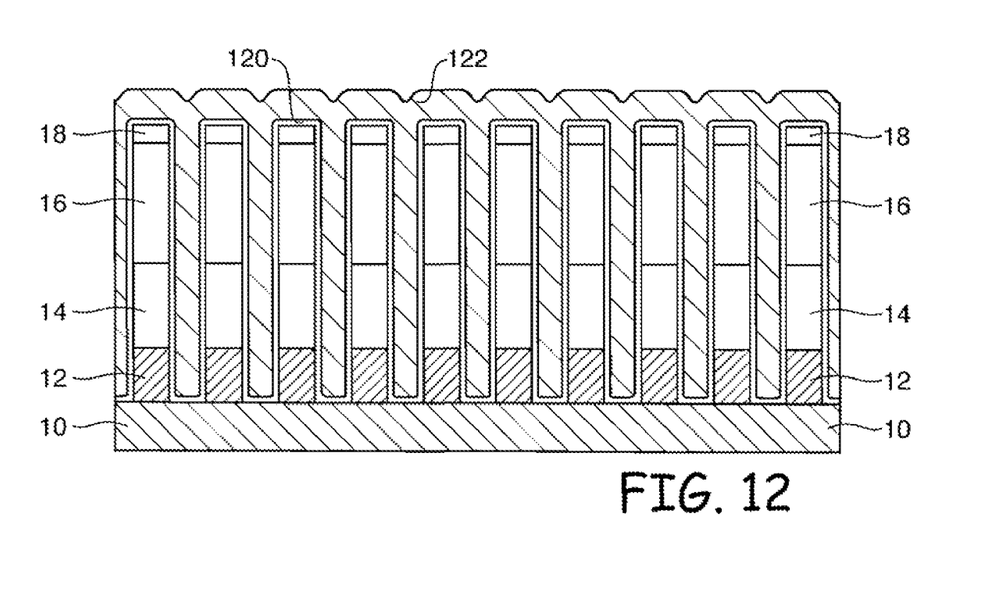
Figure 13:
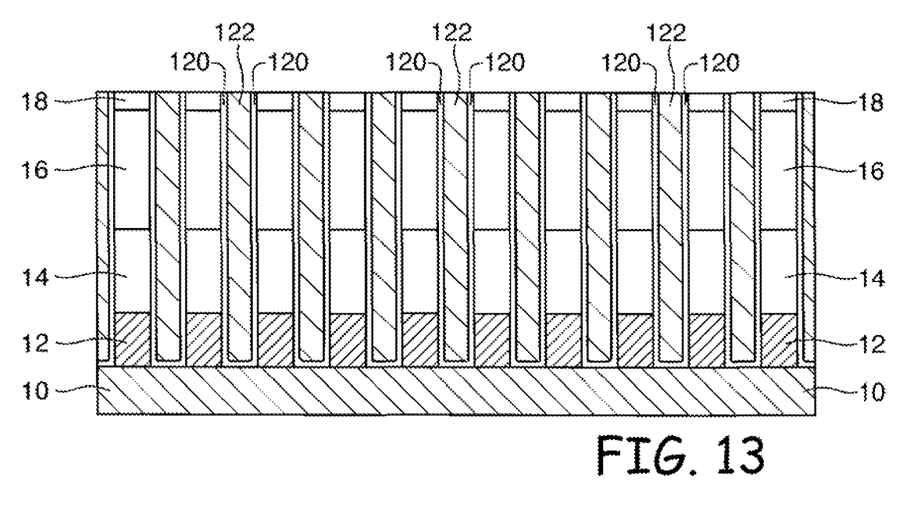

As with the previous embodiment, the structure of FIG. 11 may have various functions. One such function is depicted in FIGS. 12 and 13. In FIG. 12, a blanket dielectric 120 and a blanket conductive material 122 have been formed over the FIG. 11 structure and within openings 110. Dielectric 120 and conductive material 122 may then be planarized using mechanical planarization, such as CMP, to result in the structure of FIG. 13. These features may be used as conductive lines, or may have other uses. As depicted in FIG. 13, each conductive feature 122 would have similar cross sections and electrical properties which may differ because of processing variances.

The actual structures represented by FIGS. 8 and 13 may have other features depending on the intended use of the embodiments of the present invention which are not immediately germane to the present processes and structures, and which have not been described or depicted for simplicity of explanation. Various uses for the processes and structures are likely, such as for use for vertical transistors or capacitors, hard masks, shallow trench isolation, and for other device features in the array and periphery.

Figure 14:
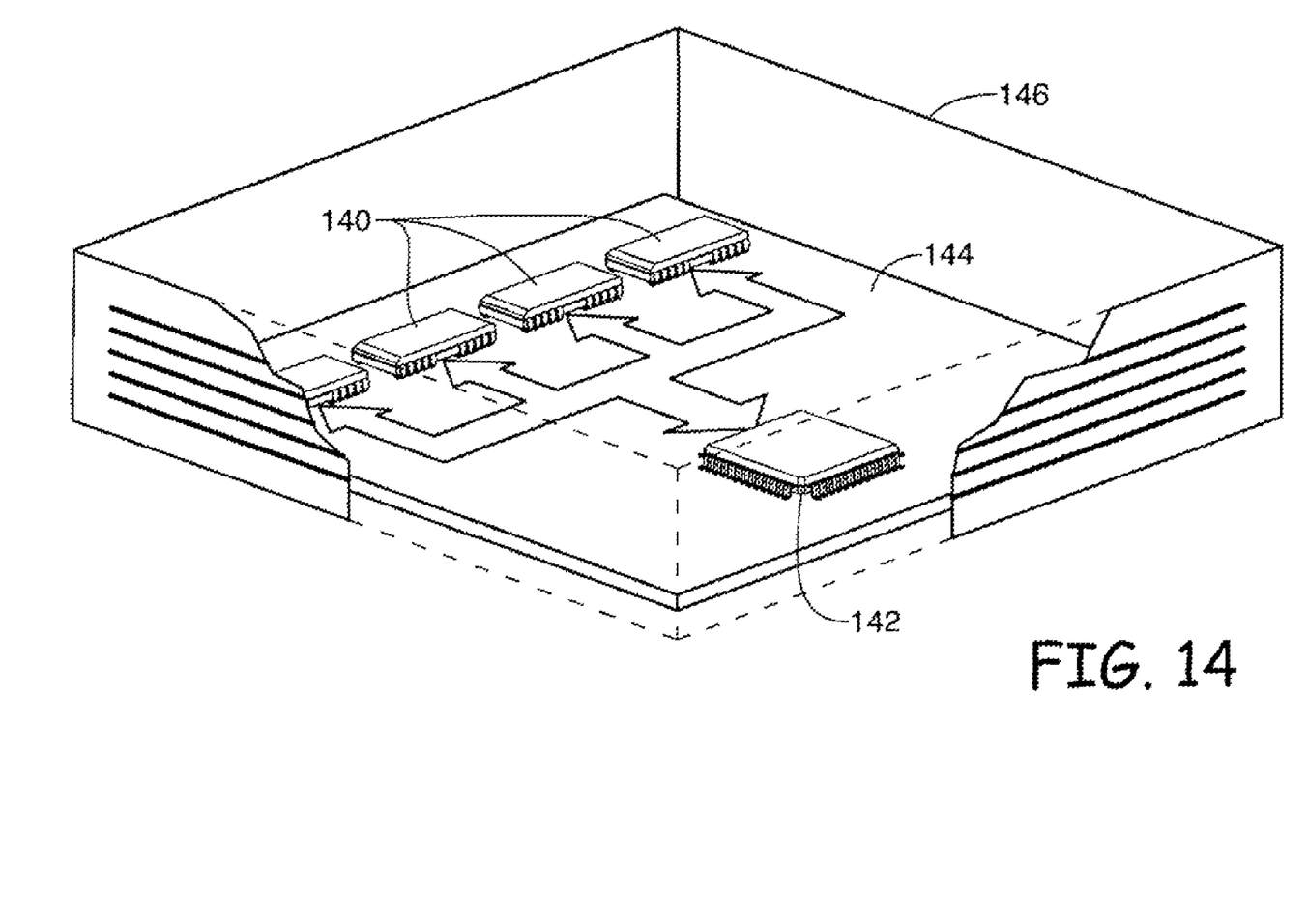
FIG. 14 is an isometric depiction of various components which may be manufactured using devices formed with an embodiment of the present invention.

As depicted in FIG. 14, a semiconductor device 140 formed in accordance with an embodiment of the disclosed invention may be attached along with other devices such as a microprocessor 142 to a printed circuit board 144, for example to a computer motherboard or as a part of a memory module used in a personal computer, a minicomputer, or a mainframe 146. FIG. 14 may also represent use of device 140 in other electronic devices comprising a housing 146, for example devices comprising a microprocessor 142, related to telecommunications, the automobile industry, semiconductor test and manufacturing equipment, consumer electronics, or virtually any piece of consumer or industrial electronic equipment.

Figure 15:
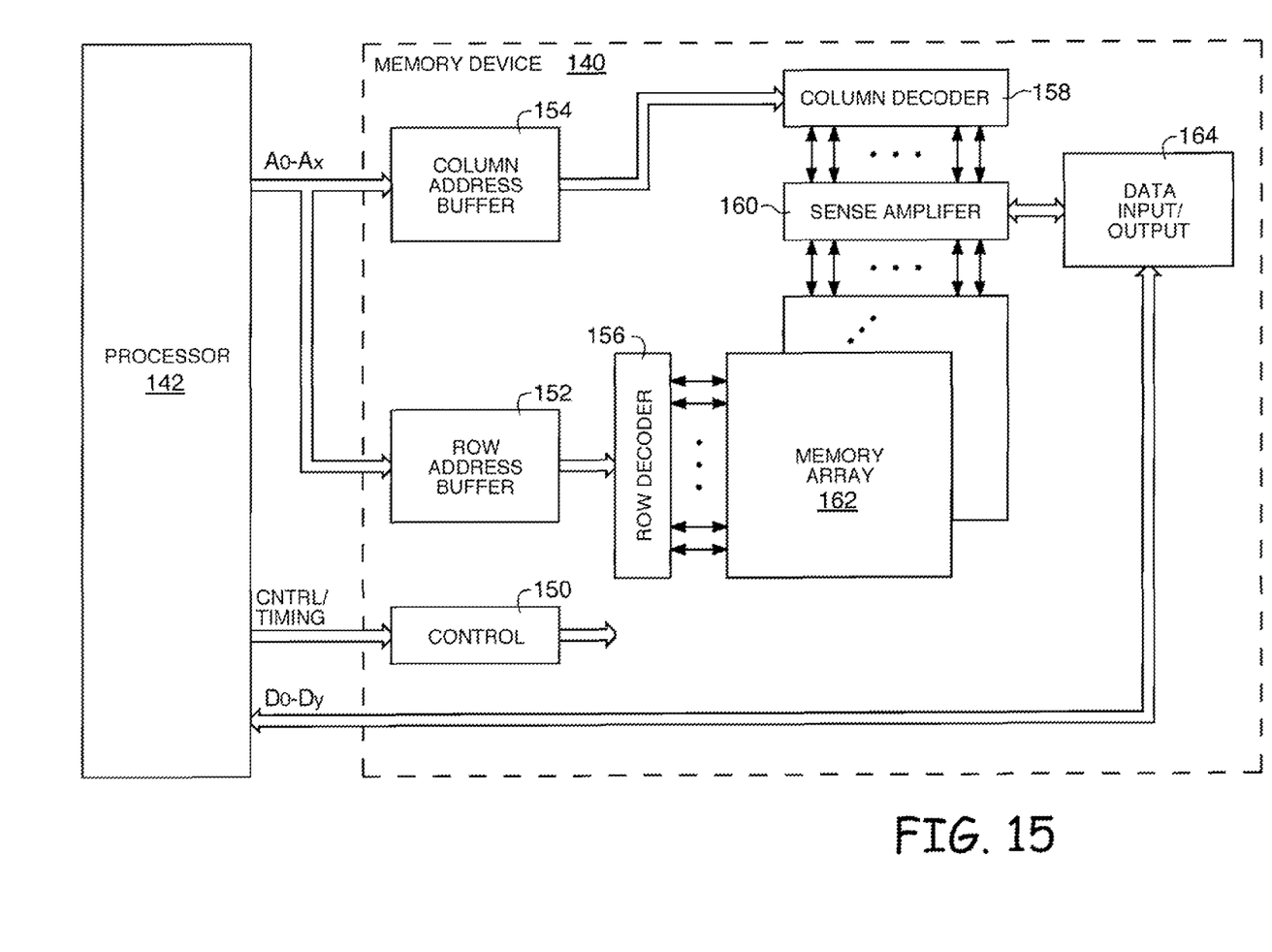
FIG. 15 is a block diagram of an embodiment of the invention to form part of a memory device having a storage transistor array.

The process and structure described herein can be used to manufacture a number of different structures comprising a metal material formed according to the inventive process to result in a densified metal material having decreased resistance and reduced contamination compared with conventional materials. FIG. 15, for example, is a simplified block diagram of a device such as a dynamic random access memory which may comprise conductive interconnects and other features which may be formed using an embodiment of the present invention. The general operation of such a device is known to one skilled in the art. FIG. 15 depicts a processor 142 coupled to a memory device 140, and further depicts the following basic sections of a memory integrated circuit: control circuitry 150; row address buffer 152 and column address buffer 154; row decoder 156 and column decoder 158; sense amplifiers 160; memory array 162; and data input/output 164.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

The invention claimed is:

1. A method used during semiconductor device feature fabrication, comprising:
   forming at least one material to be etched;
   forming a plurality of first mask features at first locations and a plurality of second mask features over the material to be etched;
   partially etching into the material to be etched with a first etch at second locations, and leaving the material to be etched unetched at the first locations;
   removing the first mask features; then
   with the second mask features exposed, etching the material to be etched with a second etch at both the first and second locations.

2. The method of claim 1 wherein the process act of etching into the material to be etched with the first etch at second locations is performed with both the first and second mask features exposed.

3. The method of claim 1 further comprising:
   etching a first volume of material from the material to be etched at the first locations to form first openings during the second etch; and
   etching a second volume of material from the material to be etched at the second locations to form second openings during the first and second etches, with the second volume of material being different from the first volume of material.

4. The method of claim 3 wherein the second volume of material etched is less than the first volume of material etched.

5. The method of claim 4 further comprising forming a conductive material to fill the first and second openings, wherein a first cross sectional area of the conductive material within the first opening is different than a second cross sectional area of the conductive material within the second opening.

6. The method of claim 5 wherein the second cross sectional area is less than the first cross sectional area.

7. A method used during fabrication of a semiconductor device, comprising:
   forming a plurality of mask features over a material to be etched, wherein the plurality of mask features have uniform dimensions and a regular pitch;
   forming a conformal spacer material over the material to be etched and on the plurality of mask features;
   etching the conformal spacer material to form a plurality of spacers, with paired spacers contacting at least a portion of each mask feature;
   with the plurality of mask features and the plurality of spacers exposed, partially etching the material to be etched to form a plurality of partially etched first openings therein;
   removing the plurality of mask features to form an opening between each of the paired spacers; then
   with the plurality of spacers exposed, etching the material to be etched through the opening between each of the paired spacers to form second openings within the material to be etched and further etching the partially etched first openings to form completed first openings, wherein the second openings comprise a different cross sectional profile than the completed first openings.

8. The method of claim 7 further comprising:
   forming a conductive material within the second openings and within the completed first openings; and
   planarizing the conductive material to remove the conductive material from over the material to be etched,
   wherein a first volume of conductive material within the completed first openings is less than a second volume of conductive material within the second openings.

9. The method of claim 7 further comprising:
   forming the second openings to have a rectangular profile; and forming the completed first openings to have a "V" shaped profile.

10. A method used during fabrication of a semiconductor device, comprising:
 forming polysilicon over a semiconductor wafer substrate assembly comprising at least a portion of a semiconductor wafer;
 forming silicide on the polysilicon;
 forming oxide on the silicide;
 forming transparent carbon (TC) on the oxide;
 forming dielectric antireflective coating (DARC) on the TC;
 forming a plurality of first mask features at first locations and a plurality of second mask features over the DARC;
 with both the first and second mask features exposed, etching the DARC using an isotropic etch and stopping the etch when the TC is exposed;
 removing the first mask features; then
 with the second mask features exposed, etching the TC at the first location and stopping on or in the oxide to form a first opening while etching the DARC, the TC, the oxide and the silicide at a second location and stopping on or in the polysilicon to form a second opening;
 etching a first volume of material from the DARC and the TC to form the first opening; and
 etching a second volume of material from the DARC, the TC, the oxide, and the silicide to form the second opening, wherein the second volume is greater than the first volume.

11. The method of claim 10 further comprising forming a conductive material to fill the first and second openings, wherein a first cross sectional area of the conductive material within the first opening is less than a second cross sectional area of the conductive material within the second opening.

12. A method for forming asymmetrical semiconductor device features, comprising:
 forming a material to be etched;
 forming a patterned mask having a plurality of symmetrical features over the material to be etched;
 forming a spacer material over the plurality of symmetrical features;
 etching the spacer material to form a plurality of spacers, with two cross sectional spacers contacting at least a portion of the plurality of symmetrical features;
 with the spacers and the patterned mask exposed, etching the material to be etched at a plurality of first locations, while a plurality of second locations remain unetched;
 removing the patterned mask; then
 with the spacers exposed, etching the material to be etched at the plurality of first locations and at the plurality of second locations to result in the material to be etched comprising first etched features at the first location having a first cross sectional profile and second etched features at the second location having a second cross section different from the first cross section.

13. The method of claim 12 further comprising forming the material to be etched using a method comprising:
 forming a tungsten silicide material;
 forming a tetraethyl orthosilicate glass material on the tungsten silicide material;
 forming a transparent carbon material on the tetraethyl orthosilicate glass material; and
 forming a dielectric antireflective coating on the transparent carbon material.

14. The method of claim 13 further comprising forming the tungsten silicide material on a polysilicon material.

15. The method of claim 12 further comprising:
 forming a conformal conductive material within the first etched features, within the second etched features, and over the material to be etched; and
 removing the conformal conductive material from over the material to be etched, wherein subsequent to removing the conformal conductive material from over the material to be etched the first and second etched features remain filled with conductive material.

* * * * *